US009728873B2

(12) United States Patent
Komoto et al.

(10) Patent No.: US 9,728,873 B2
(45) Date of Patent: Aug. 8, 2017

(54) CONNECTOR MOUNTABLE ON A CIRCUIT BOARD AND CONNECTABLE WITH A MATING CONNECTOR HAVING A HOUSING AND ROWS OF CONTACTS WITH FIXED PORTIONS EXTENDING INTO AN OPENING OF A HOUSING

(71) Applicant: Japan Aviation Electronics Industry, Limited, Tokyo (JP)

(72) Inventors: Tetsuya Komoto, Tokyo (JP); Osamu Hashiguchi, Tokyo (JP); Yu Tatebe, Tokyo (JP); Keisuke Nakamura, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 15/221,004

(22) Filed: Jul. 27, 2016

(65) Prior Publication Data

US 2017/0125930 A1 May 4, 2017

(30) Foreign Application Priority Data

Oct. 30, 2015 (JP) ................................ 2015-214798

(51) Int. Cl.

| | |
|---|---|
| ***H01R 12/00*** | (2006.01) |
| ***H05K 1/00*** | (2006.01) |
| ***H01R 12/71*** | (2011.01) |
| ***H01R 13/115*** | (2006.01) |
| ***H01R 13/405*** | (2006.01) |

(52) U.S. Cl.
CPC ......... *H01R 12/716* (2013.01); *H01R 13/115* (2013.01); *H01R 13/405* (2013.01)

(58) Field of Classification Search
CPC .. H01R 12/716; H01R 13/405; H01R 13/115; H01R 12/71
USPC ........................................................... 439/65
See application file for complete search history.

(56) References Cited

U.S. PATENT DOCUMENTS

| | | | | |
|---|---|---|---|---|
| 7,354,279 | B2 | 4/2008 | Uesaka | |
| 7,632,107 | B2 | 12/2009 | Mizumura | |
| 7,637,762 | B2 | 12/2009 | Uesaka | |
| 8,647,129 | B2 * | 2/2014 | Takahashi ............ | H01R 12/718 439/513 |

FOREIGN PATENT DOCUMENTS

| | | | |
|---|---|---|---|
| JP | H10-326651 | A | 12/1998 |
| JP | 2003-163054 | A | 6/2003 |
| JP | 2004-247304 | A | 9/2004 |

(Continued)

*Primary Examiner* — Javaid Nasri
(74) *Attorney, Agent, or Firm* — Collard & Roe, P.C.

(57) ABSTRACT

A connector is mountable on a circuit board and connectable with a mating connector. The connector comprises a housing and a plurality of contacts which are held by the housing. The contacts form two or more contact rows. The contacts of each of the contact rows are arranged in a pitch direction. Each of the contacts has a fixed portion which is fixed to the circuit board when the connector is mounted on the circuit board. The housing has one or more openings each of which is positioned between neighboring two of the contact rows in a predetermined direction perpendicular to the pitch direction. Two or more of the fixed portions extend into one of the openings.

14 Claims, 10 Drawing Sheets

(56) References Cited

FOREIGN PATENT DOCUMENTS

| | | | |
|---|---|---|---|
| JP | 2007-149477 | A | 6/2007 |
| JP | 2008-522386 | A | 6/2008 |
| JP | 2012-099276 | A | 5/2012 |
| JP | 2012-252785 | A | 12/2012 |
| JP | 5757794 | B2 | 7/2015 |

* cited by examiner

CONNECTOR MOUNTABLE ON A CIRCUIT BOARD AND CONNECTABLE WITH A MATING CONNECTOR HAVING A HOUSING AND ROWS OF CONTACTS WITH FIXED PORTIONS EXTENDING INTO AN OPENING OF A HOUSING

CROSS REFERENCE TO RELATED APPLICATIONS

This application is based on and claims priority under 35 U.S.C.§119 to Japanese Patent Application No. JP2015-214798 filed Oct. 30, 2015, the contents of which are incorporated herein in their entirety by reference.

BACKGROUND OF THE INVENTION

This invention relates to a connector which is mountable on a circuit board and which is mateable with a mating connector, and to a connector assembly.

Referring to FIGS. 17 to 19, JP-A 2008-522386 (Patent Document 1) discloses a first connector 900 and a second connector 950. The first connector 900 is mountable on a circuit board 930, and the second connector 950 is mountable on a circuit board 980. The first connector 900 and the second connector 950 are connectable with each other. As shown in FIG. 17, the first connector 900 of Patent Document 1 comprises a plurality of first terminals 910 and a first housing 920 which holds the first terminals 910. Each of the first terminals 910 has a solder tail portion 912. The first housing 920 is formed with a plurality of first terminal accommodating cavities 922. The first terminals 910 are accommodated in the first terminal accommodating cavities 922, respectively. As shown in FIG. 18, the second connector 950 of Patent document 1 comprises a plurality of second terminals 960 and a second housing 970 which holds the second terminals 960. Each of the second terminals 960 has a solder tail portion 962. The second housing 970 is formed with a plurality of second terminal accommodating cavities 972. The second terminals 960 are accommodated in the second terminal accommodating cavities 972, respectively. As shown in FIG. 19, the solder tail portions 912 of the first connector 900 are soldered to wiring lands 932, respectively, of the circuit board 930, and the solder tail portions 962 of the second connector 950 are soldered to wiring lands 982, respectively, of the circuit board 980. The first connector 900 and the second connector 950 which are mounted on the circuit boards 950 and 980, respectively, are mated with each other so that the first terminals 910 of the first connector 900 are connected with the second terminals 960, respectively, of the second connector 950.

SUMMARY OF THE INVENTION

It is an object of the present invention to provide a connector which can be manufactured in a simplified process.

One aspect (first aspect) of the present invention provides a connector mountable on a circuit board and connectable with a mating connector. The connector comprises a housing and a plurality of contacts which are held by the housing. The contacts form two or more contact rows. The contacts of each of the contact rows are arranged in a pitch direction. Each of the contacts has a fixed portion which is fixed to the circuit board when the connector is mounted on the circuit board. The housing has one or more openings each of which is positioned between neighboring two of the contact rows in a predetermined direction perpendicular to the pitch direction. Two or more of the fixed portions extend into one of the openings.

Another aspect (second aspect) of the present invention provides a connector including the features of the first aspect. The connector is a plug. The housing further has two or more plug contact supporters and one or more plug recesses. The plug contact supporters correspond to the contact rows, respectively. Each of the plug contact supporters extends long in the pitch direction. Each of the plug recesses is positioned between neighboring two of the plug contact supporters in the predetermined direction. The openings are positioned within the plug recesses, respectively.

Still another aspect (third aspect) of the present invention provides a connector including the features of the first aspect. The connector is a receptacle. Each of the contacts further has a spring portion and a contact point. The spring portion is resiliently deformable. The contact point is supported by the spring portion. The housing further has two or more receptacle contact supporters, two or more island-like portions, one or more receptacle recesses and one or more receiving portions. The receptacle contact supporters correspond to the contact rows, respectively. The island-like portions correspond to the contact rows, respectively. Each of the receptacle contact supporters extends long in the pitch direction. Each of the island-like portions partially accommodates the spring portions of the contacts of the corresponding contact row. Each of the island-like portions extends long in the pitch direction. In the predetermined direction, the receiving portions are positioned between the receptacle contact supporter and the island-like portion both of which correspond to one of the two or more contact rows. In the predetermined direction, the receptacle recesses are positioned between the receptacle contact supporter, which corresponds to one of the two or more contact rows, and the island-like portion which corresponds to one of remaining ones of the two or more contact rows. The openings are positioned within the receptacle recesses, respectively.

Yet another aspect (fourth aspect) of the present invention provides a connector assembly comprising the connector of the second aspect and the connector of the third aspect. The connector of the second aspect functions as the plug. The connector of the third aspect functions as the receptacle.

In the connector of the present invention, two or more of the fixed portions of the contacts extend into one of the openings. Accordingly, the contacts, which are coupled with a carrier, can be together installed into the housing. In detail, the contacts coupled with the carrier are together press-fit into the housing, and a cutting jig is then inserted into the one of the openings, so that the contacts are simultaneously separated from the carrier. Thus, the present invention enables the connector to be manufactured in a simplified process.

An appreciation of the objectives of the present invention and a more complete understanding of its structure may be had by studying the following description of the preferred embodiment and by referring to the accompanying drawings.

Figure 1:
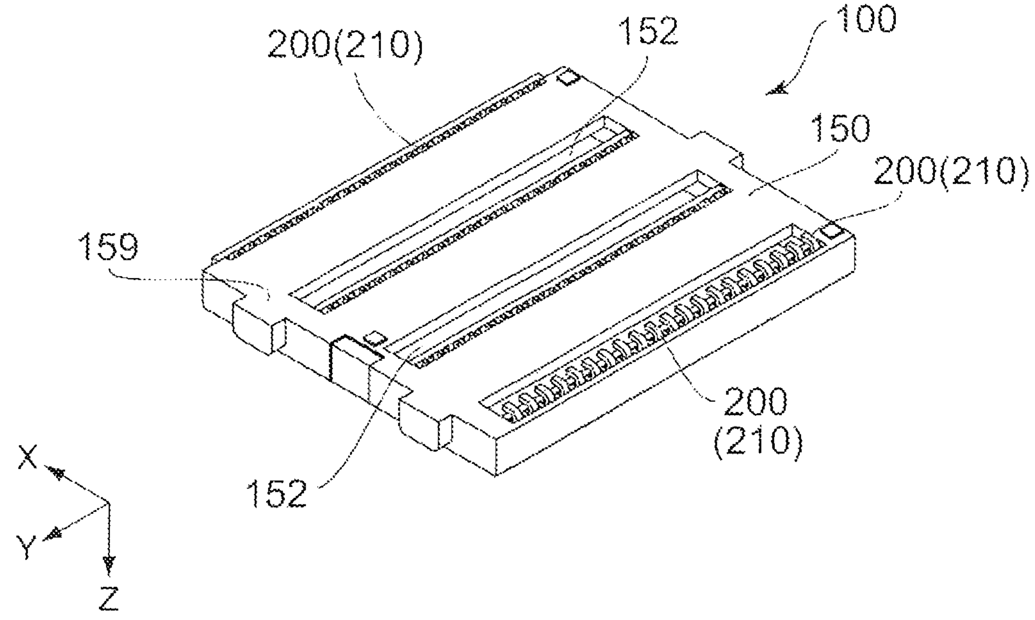
FIG. 1 is a bottom, perspective view showing a state where a plug according to an embodiment of the present invention is being assembled.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Referring to FIGS. 1, 7, 13 and 14, a connector assembly 10 according to an embodiment of the present invention comprises a plug (connector) 100 and a receptacle (connector) 300.

As understood from FIGS. 1 and 13 to 16, the plug 100 according to an embodiment of the present invention is mountable on a circuit board (not shown) and is connectable with the receptacle 300 as a mating connector along an up-down direction. Explanation will be made later about specific connection of the plug 100 and the receptacle 300. In the present embodiment, the up-down direction is a Z-direction.

As shown in FIGS. 1 to 4, the plug 100 of the present embodiment comprises a plug housing (housing) 150 and a plurality of plug contacts (contacts) 200 which are held by the plug housing 150. Specifically, the plug housing 150 is made of insulator, and each of the plug contacts 200 is made of metal.

As shown in FIGS. 1 to 4, the plug housing 150 of the present embodiment has a main plate portion 155. four plug contact supporters 151, a plurality of plug holding portions 156, a plurality of press-fitted portions 154 and three plug recesses 158.

Figure 2:
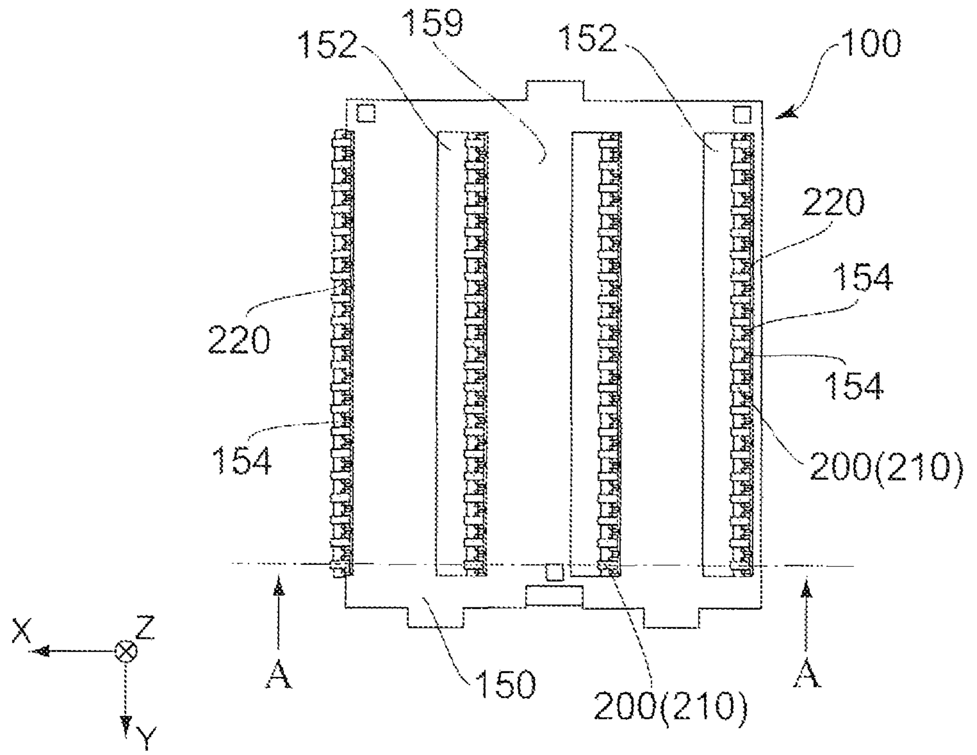
FIG. 2 is a bottom view showing the plug according to the embodiment of the present invention.
Figure 3:
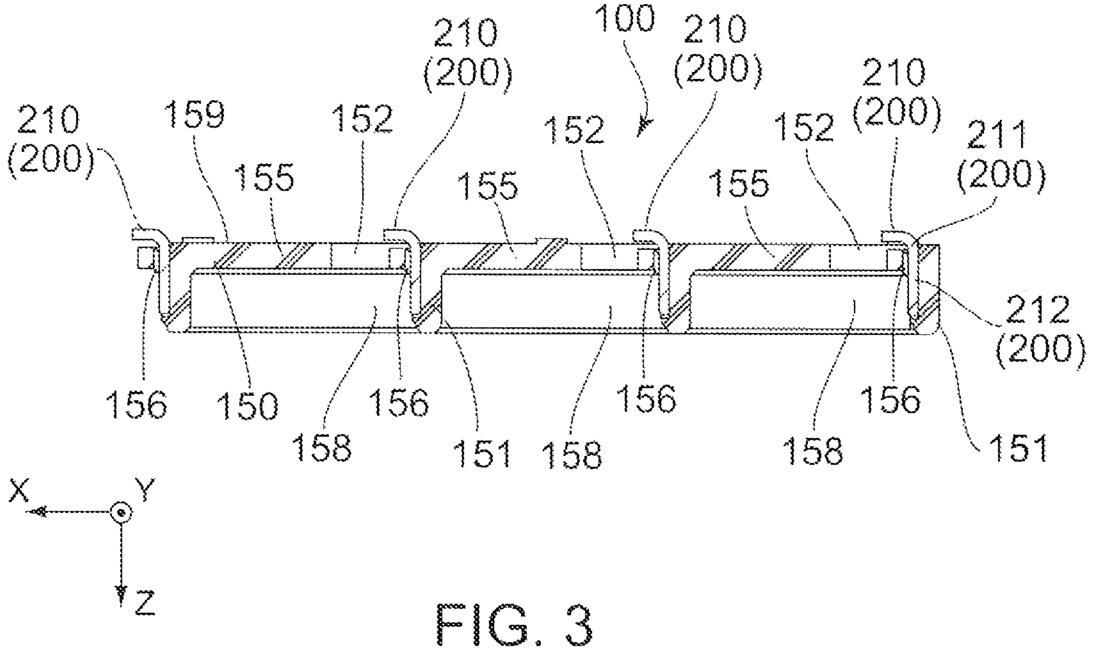
FIG. 3 is a cross-sectional view showing the plug of FIG. 2, taken along line A-A.
Figure 4:
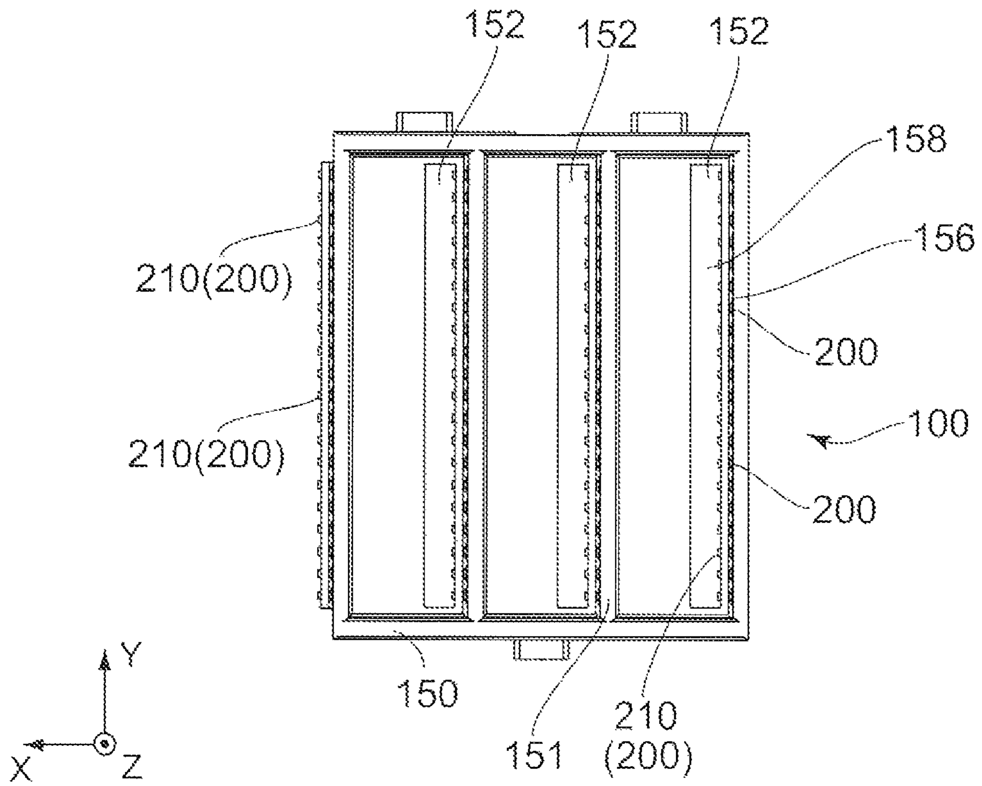
FIG. 4 is a top view showing the plug of FIG. 2.

As shown in FIGS. 2 to 4, the main plate portion 155 is provided with a first principal surface 159 and three openings 152. The first principal surface 159 forms a negative Z-side surface of the main plate portion 155 and extends in a plane which is defined by a pitch direction and a predetermined direction perpendicular to the pitch direction. Each of the openings 152 pierces the first principal surface 159 in the up-down direction. In the present embodiment, the pitch direction is a Y-direction, and the predetermined direction is an X-direction.

As shown in FIG. 3, each of the plug contact supporters 151 extends from the main plate portion 155 in a positive Z-direction. Each of the plug contact supporters 151 extends long in the pitch direction. Each of the plug contact supporters 151 is provided with the plug holding portions 156 and the press-fitted portions 154. Each of the plug holding portions 156 is a hole which pierces the main plate portion 155 in the up-down direction. Two of the press-fitted portions 154 are positioned in the vicinity of an end of each of the plug holding portions 156 in a negative Z-direction and are positioned at opposite outsides, respectively, of each of the plug holding portions 156 in the pitch direction.

As understood from FIGS. 3 and 4, each of the plug recesses 158 is positioned between neighboring two of the plug contact supporters 151 in the predetermined direction. The openings 152 are positioned within the plug recesses 158, respectively.

The plug contacts 200 of the present embodiment form four plug contact rows. The plug contacts 200 of each of the plug contact rows are arranged in the pitch direction. The plug contact rows, each of which consists of the plug contacts 200, correspond to the plug contact supporters 151, respectively. Each of the plug contact rows is positioned at a side of the corresponding plug contact supporter 151 in a positive X-direction. Each of the openings 152 is positioned between neighboring two of the plug contact rows in the predetermined direction. The plug holding portions 156 correspond to the plug contacts 200, respectively.

Figure 5:
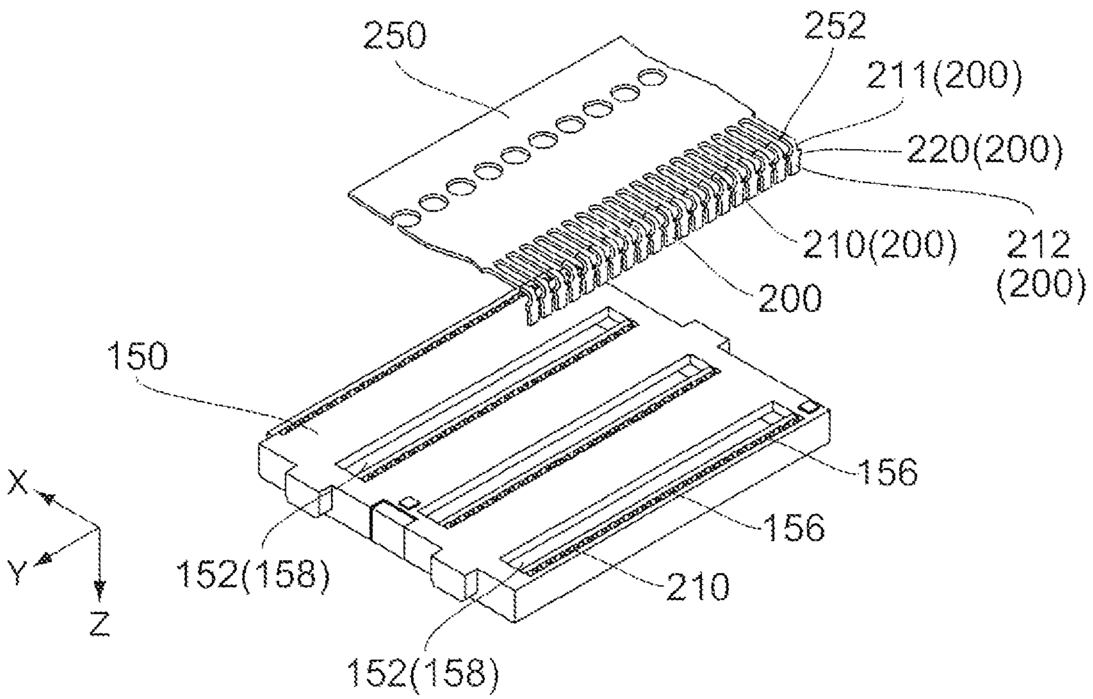
FIG. 5 is a perspective view for use in explaining an assembly process of the plug of FIG. 2, wherein plug contacts are not attached to a plug housing and are coupled with a carrier.
Figure 6:
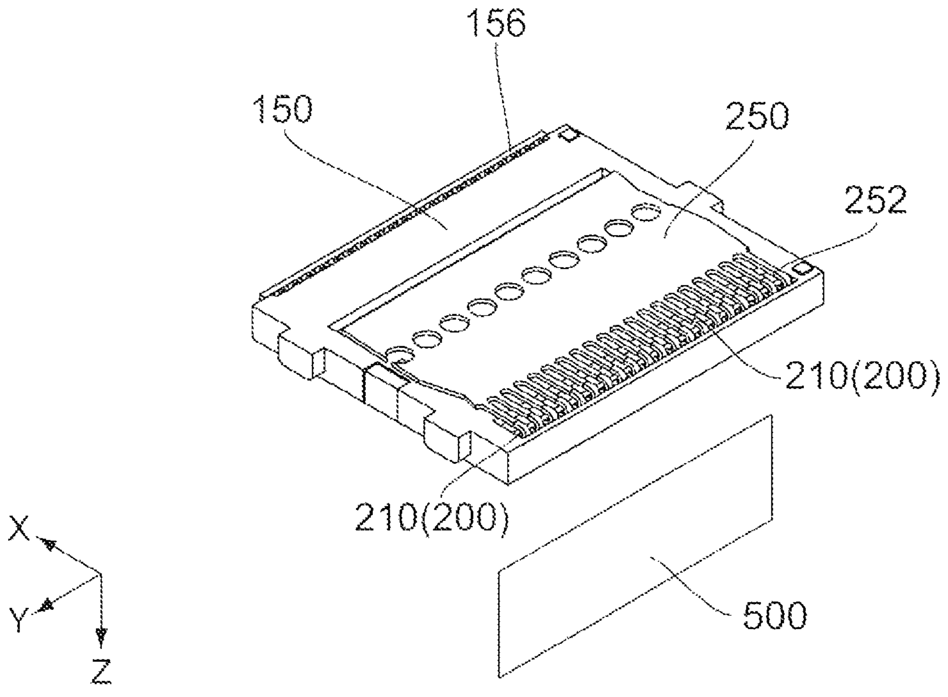
FIG. 6 is a perspective view showing a process following the assembly process of FIG. 5, wherein the plug contacts are press-fit into the plug housing and the carrier is not yet separated therefrom.

As shown in FIGS. 2, 3 and 5, each of the plug contacts 200 of the present embodiment has a fixed portion 210, a first coupling portion 211, a contact portion 212 and two press-fit portions 220.

The fixed portion 210 is fixed to a circuit board (not shown) by soldering when the plug 100 is mounted on the circuit board (not shown). As shown in FIGS. 2 and 4, all of the fixed portions 210 of the plug contacts 200 of the plug contact row extend in one of the openings 152 in the predetermined direction. Specifically, all of the fixed portions 210 of the plug contacts 200 of one of neighboring two of the plug contact rows in the predetermined direction extend in one of the openings 152. In the present embodiment, the fixed portion 210 of each of the plug contacts 200 extends in the positive X-direction. The fixed portion 210 of each of the plug contacts 200 is exposed on the first principal surface 159.

As shown in FIG. 3, the first coupling portion 211 couples the contact portion 212 and the fixed portion 210 with each other. The first coupling portion 211 of the present embodiment has an L-like shape.

Figure 16:
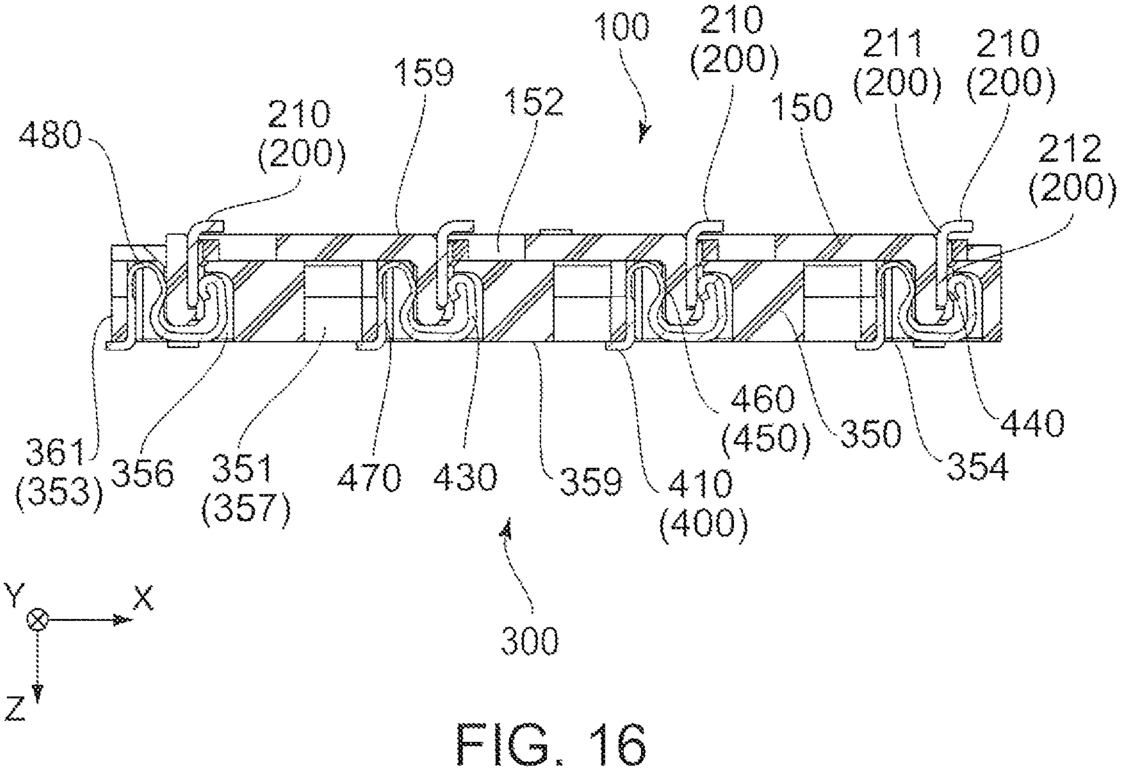
FIG. 16 is a cross-sectional view showing the connector assembly of FIG. 15, taken along line C-C.
Figure 17:
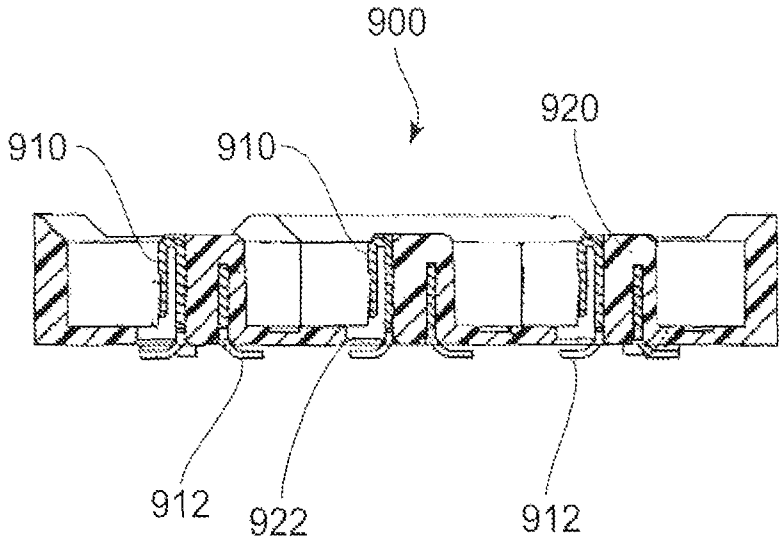
FIG. 17 PRIOR ART
FIG. 17 is a cross-sectional view showing a first connector of Patent Document 1.
Figure 18:
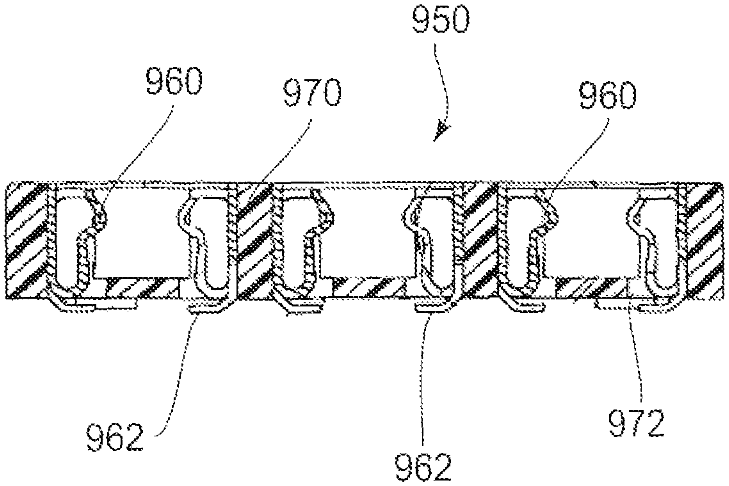
FIG. 18 PRIOR ART
FIG. 18 is a cross-sectional view showing a second connector of Patent Document 1.
Figure 19:
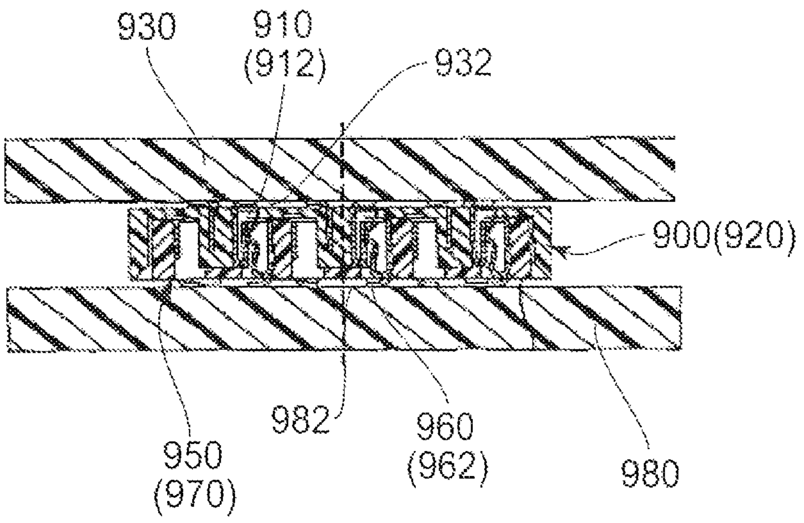
FIG. 19 PRIOR ART
FIG. 19 is cross-sectional view showing a mated state of the first connector and the second connector of Patent Document 1.

As understood from FIGS. 3 and 16, the contact portion 212 extends from a positive Z-side end of the first coupling portion 211 in the positive Z-direction.

As understood from FIGS. 2 and 5, the press-fit portions 220 are positioned at opposite ends, respectively, of the contact portion 212 in the pitch direction, and each of the press-fit portions 220 projects outward in the pitch direction. The press-fit portions 220 are portions which are held by the press-fitted portions 154, respectively, of the plug housing 150 by biting thereinto when each of the plug contacts 200 is press-fit into the corresponding plug holding portion 156 of the plug contact supporter 151 of the plug housing 150.

Referring to FIGS. 1, 2, 5 and 6, the plug contacts 200 are attached to the plug housing 150 as described below.

First, as shown in FIG. 5, the plug contacts 200, which are not yet attached to the plug housing 150, are in a state of being coupled with a carrier 250. Then, the first coupling portions 211 of the plug contacts 200 coupled with the carrier 250 are pushed in the up-down direction by a jig (not shown) under a state where each of the plug contacts 200 is positioned to face the corresponding plug holding portion 156 of the plug housing 150 in the up-down direction. Accordingly, the plug contacts 200 coupled with the carrier 250 can be together installed into the plug housing 150. In detail, when the first coupling portions 211 of the plug contacts 200 coupled with the carrier 250 are pushed in the positive Z-direction by the jig, each of the plug contacts 200 is press-fit into the corresponding plug holding portion 156 of the plug contact supporter 151 of the plug housing 150 in the positive Z-direction so that each of the press-fit portions 220 of the plug contacts 200 bites into the corresponding press-fitted portion 154 of the plug housing 150. Thus, each of the press-fit portions 220 of the plug contacts 200 is held by the corresponding press-fitted portion 154 of the plug housing 150. Meanwhile, as understood from FIGS. 4 and 6, when the plug 100 is viewed from a positive Z-side thereof along the up-down direction, the fixed portion 210 of each of the plug contacts 200 is visible through the plug recess 158 and the opening 152 of the plug housing 150.

Next, a cutting jig 500 is inserted into the opening 152 of the plug 100 from the positive Z-side thereof along the up-down direction, and a negative Z-side end of the cutting jig 500 presses connecting points 252 each of which connects the carrier 250 with the fixed portion 210, so that the carrier 250 is separated and removed from the plug contacts 200. Accordingly, the plug 100 is in a state shown in FIG. 1. As described above, when the carrier 250 is to be separated and removed from the plug contacts 200 after the plug contacts 200 coupled with the carrier 250 are installed into the plug housing 150, the cutting jig 500 is inserted into the opening 152 so that the plug contacts 200 can be simultaneously separated from the carrier 250. After each of the plug contacts 200 is attached to the corresponding plug holding portion 156 of one of the plug contact supporters 151, each of the plug contacts 200 coupled with the carrier 250 is similarly press-fit into the corresponding plug holding portion 156 of the plug contact supporter 151 which is adjacent to the one of the plug contact supporters 151 in the positive X-direction. Thus, the plug contacts 200 are sequentially attached to the plug housing 150. Meanwhile, since the fixed portions 210 extend toward orientations same as each other, the aforementioned attaching operation of the plug contacts 200 can be achieved while the carrier 250 can be prevented from being brought into contact with the fixed portions 210 of the plug contacts 200 which are already press-fit thereinto. Accordingly, each of the plug contacts 200 can be prevented from being broken.

Figure 7:
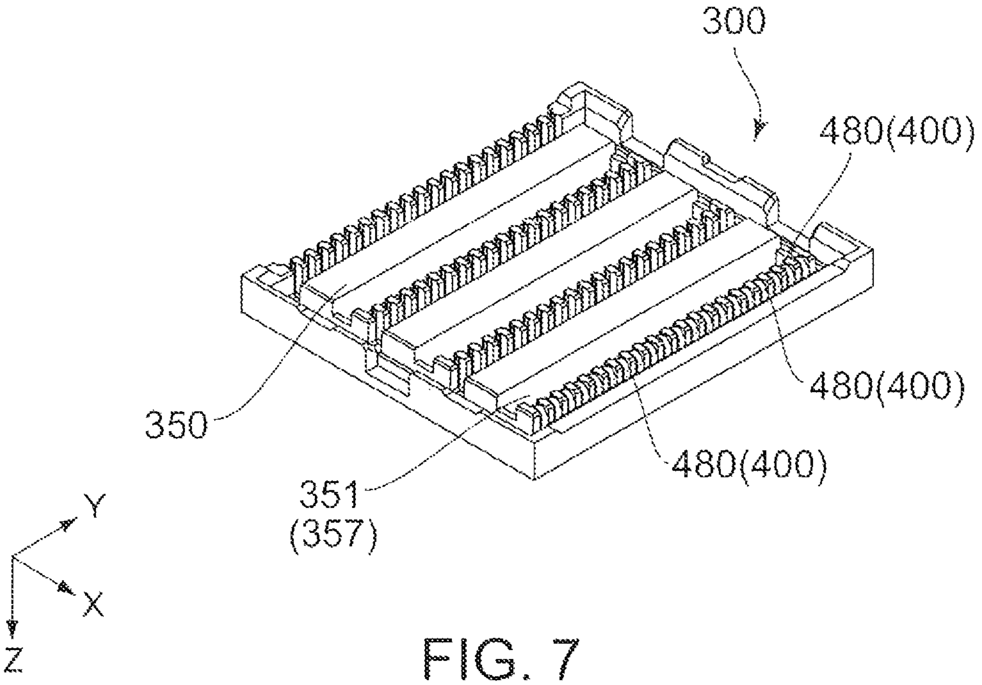
FIG. 7 is a perspective view showing a state where a receptacle according to an embodiment of the present invention is being assembled.
Figure 14:
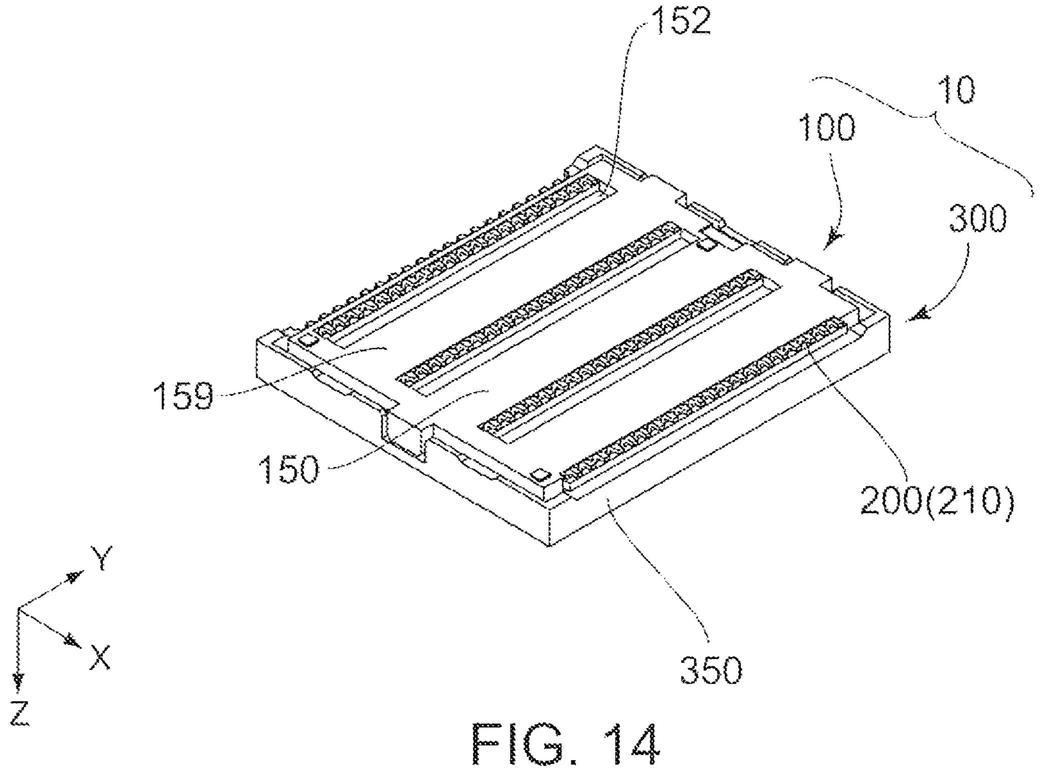
FIG. 14 is a perspective view showing a process following the connecting process of FIG. 13, wherein the plug and the receptacle are connected with each other.

As understood from FIGS. 1, 7 and 14, the receptacle 300 according to an embodiment of the present invention is mountable on a circuit board (not shown) and is connectable with the plug 100 as a mating connector along the up-down direction. In the receptacle 300 of the present embodiment, the negative Z-direction is upward and the positive Z-direction is downward. Explanation will be made later about specific connection of the plug 100 and the receptacle 300. The receptacle 300 of the present embodiment comprises a receptacle housing (housing) 350 and a plurality of receptacle contacts (contacts) 400 which are held by the receptacle housing 350. Specifically, the receptacle housing 350 is made of insulator, and each of the receptacle contacts 400 is made of metal.

Referring to FIGS. 7 to 11, the receptacle housing 350 of the present embodiment has four receptacle contact supporters 353, a plurality of receptacle holding portions 354, a plurality of press-fitted portions 352, four receiving portions 358, four island-like portions 355, a plurality of spring portion accommodators 356, three openings 351, three receptacle recesses 357 and a second principal surface 359.

As shown in FIGS. 7 to 11, each of the receptacle contact supporters 353 extends long in the pitch direction. Each of the receptacle contact supporters 353 is provided with the receptacle holding portions 354, the press-fitted portions 352 and a plurality of facing spring portion accommodators 360. Each of the receptacle holding portions 354 has a wall portion 361 which extends in the up-down direction and pierces the receptacle housing 350 in the up-down direction. Two of the press-fitted portions 352 are positioned in the vicinity of a lower end of each of the receptacle holding portions 354 and are positioned at opposite outsides, respectively, of each of the receptacle holding portions 354 in the pitch direction. The facing spring portion accommodators 360 are positioned beyond the receptacle holding portions 354, respectively, in a positive X-direction of the predetermined direction.

Figure 9:
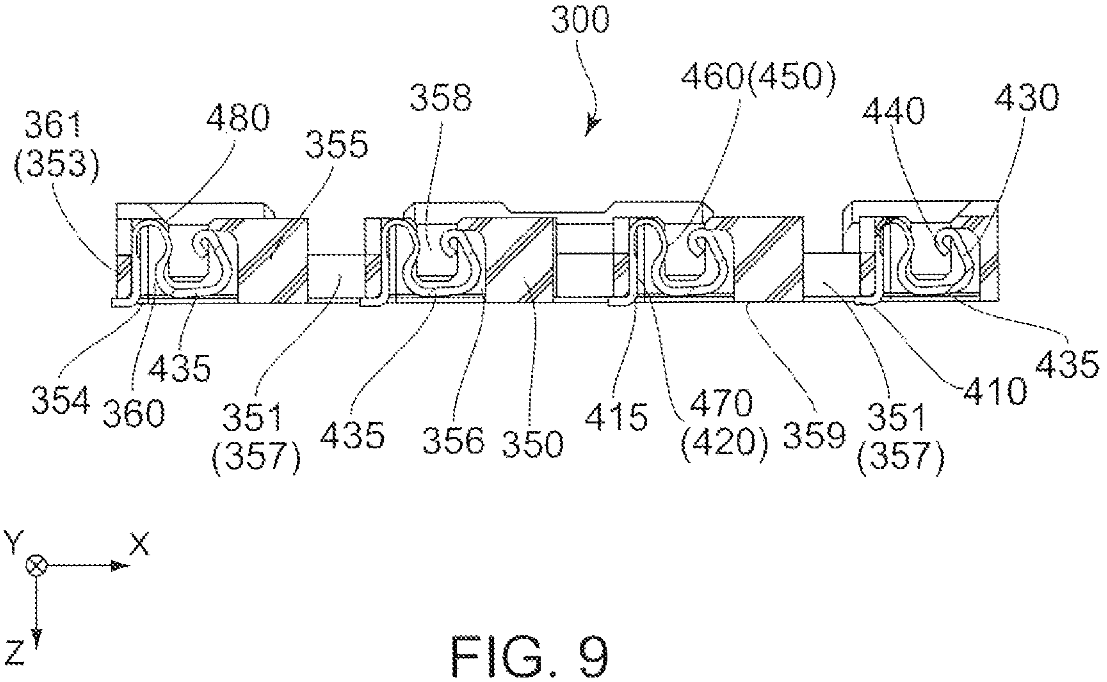
FIG. 9 is a cross-sectional view showing the receptacle of FIG. 8, taken along line B-B.

As understood from FIGS. 9 and 16, each of the receiving portions 358 is a part which receives the contact portions 212 of the plug contacts 200 and the plug contact supporter 151 of the plug housing 150 of the plug 100 when the plug 100 and the receptacle 300 are connected with each other. The receiving portions 358 correspond to the receptacle contact supporters 353, respectively. Each of the receiving portions 358 is positioned beyond the corresponding receptacle contact supporter 353 in the positive X-direction of the predetermined direction.

Figure 8:
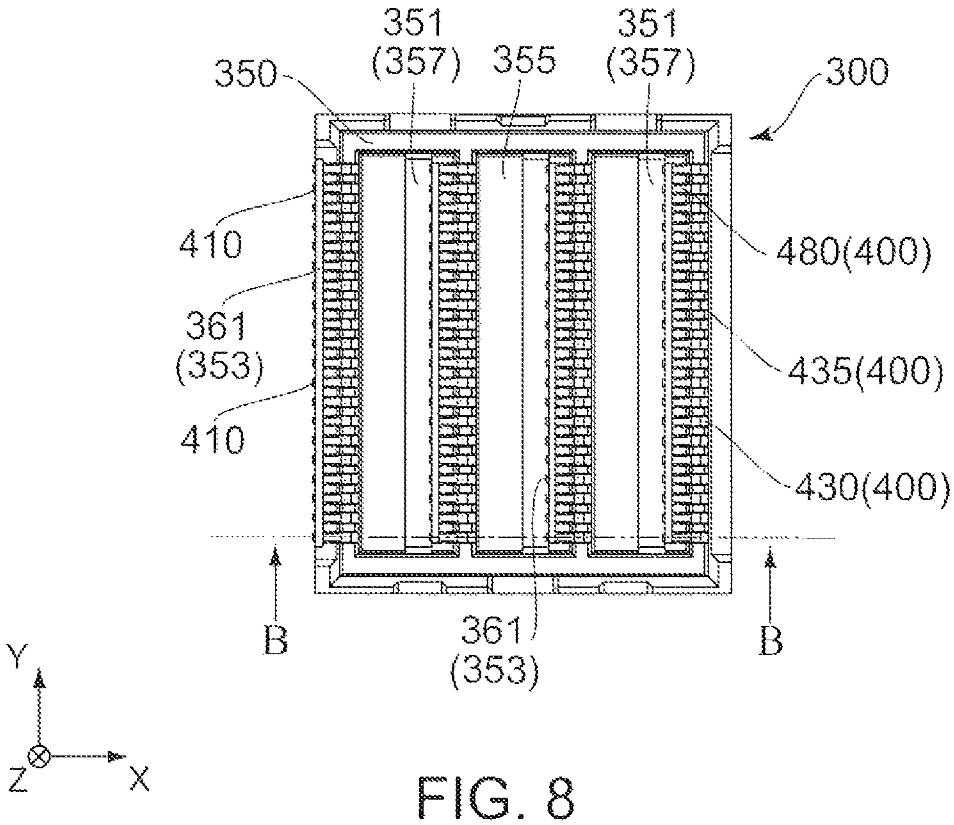
FIG. 8 is a top view showing the receptacle according to the embodiment of the present invention.

As understood from FIGS. 8 and 9, each of the island-like portions 355 extends long in the pitch direction. The island-like portions 355 correspond to the receiving portions 358, respectively. Each of the island-like portions 355 is positioned beyond the corresponding receiving portion 358 in the positive X-direction of the predetermined direction. Each of the island-like portions 355 is provided with the spring portion accommodators 356.

Figure 10:
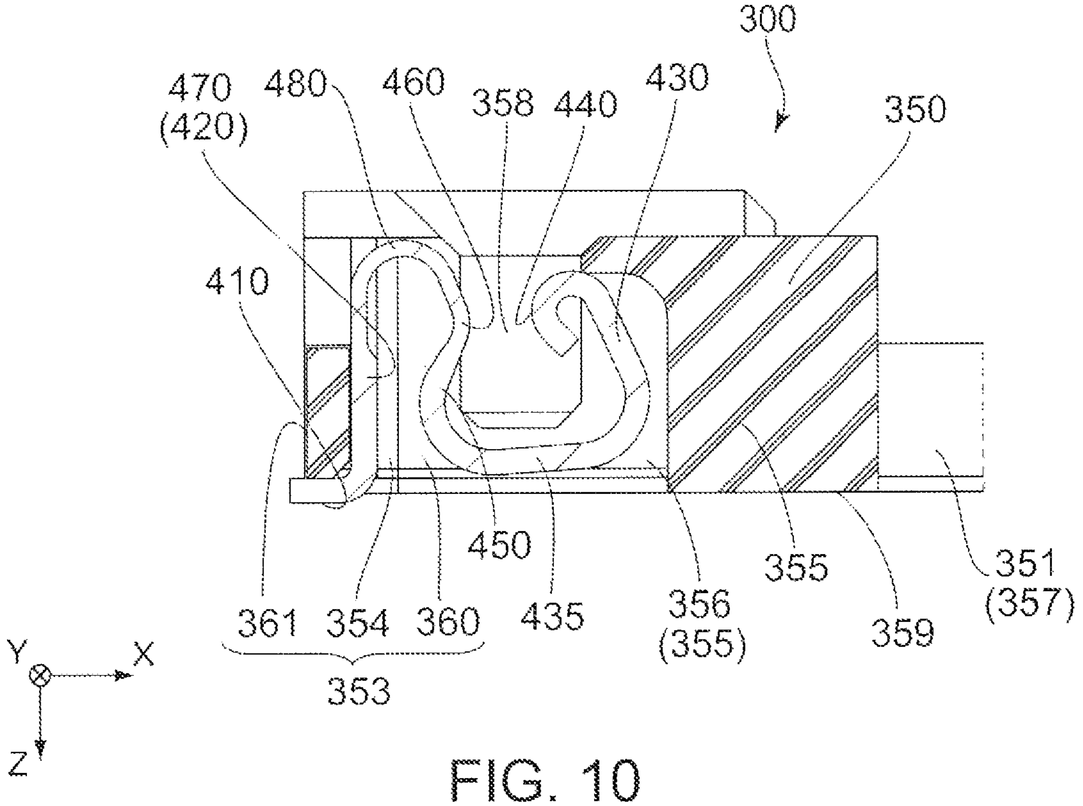
FIG. 10 is an enlarged, cross-sectional view showing a part of the receptacle of FIG. 9.
Figure 11:
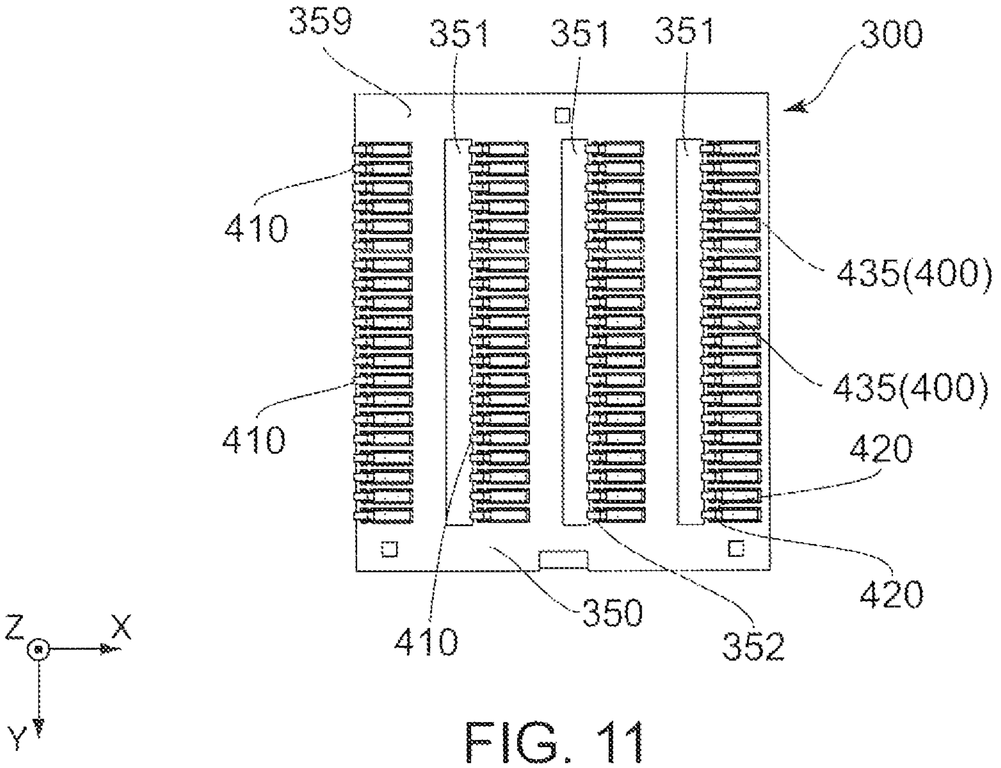
FIG. 11 is a bottom view showing the receptacle of FIG. 8.

As shown in FIGS. 8 and 9, the openings 351 are positioned within the receptacle recesses 357, respectively. As understood from FIGS. 7 to 11, each of the receptacle recesses 357 is positioned between neighboring two of the receptacle contact supporters 353 in the predetermined direction. As shown in FIGS. 9 to 11, the second principal surface 359 forms a positive Z-side surface of the receptacle housing 350 and extends in a plane which is defined by the pitch direction and the predetermined direction.

As shown in FIGS. 7 to 11, the receptacle contacts 400 according to the present embodiment form four receptacle contact rows. The receptacle contacts 400 of each of the receptacle contact rows are arranged in the pitch direction. The receptacle contact supporters 353 correspond to the receptacle contact rows, respectively. The island-like portions 355 correspond to the receptacle contact rows, respectively. In the predetermined direction, each of the receiving portions 358 is positioned between the receptacle contact supporter 353 and the island-like portion 355 both of which correspond to one of the four receptacle contact rows. Each of the openings 351 is positioned between neighboring two of the receptacle contact rows in the predetermined direction. In the predetermined direction, each of the receptacle recesses 357 is positioned between the receptacle contact supporter 353, which corresponds to one of the four receptacle contact rows, and the island-like portion 355 which corresponds to one of remaining ones of the four receptacle contact rows. The receptacle holding portions 354 correspond to the receptacle contacts 400, respectively. The spring portion accommodators 356 correspond to the receptacle contacts 400, respectively. The facing spring portion accommodators 360 correspond to the receptacle contacts 400, respectively. The plug contact rows correspond to the receptacle contact rows, respectively.

As shown in FIGS. 9 to 11, each of the receptacle contacts 400 of the present embodiment has a fixed portion 410, a second coupling portion 415, a held portion 470, two press-fit portions 420, a bent portion 480, a facing spring portion 450, a third coupling portion 435, a spring portion 430 and a contact point 440. Specifically, each of the facing spring portion 450 and the spring portion 430 is resiliently deformable.

The fixed portion 410 is fixed to a circuit board (not shown) by soldering when the receptacle 300 is mounted on the circuit board (not shown). As shown in FIGS. 8 and 11, all of the fixed portions 410 of the receptacle contacts 400 of the receptacle contact row extend in one of the openings 351. Specifically, all of the fixed portions 410 of the receptacle contacts 400 of one of neighboring two of the receptacle contact rows in the predetermined direction extend in one of the openings 351. In the present embodiment, all of the fixed portions 410 of the receptacle contacts 400 extend in the negative X-direction. The fixed portion 410 of each of the receptacle contacts 400 is exposed on the second principal surface 359.

As shown in FIGS. 9 and 10, the second coupling portion 415 couples the fixed portion 410 and the held portion 470 with each other. The second coupling portion 415 of the present embodiment has an L-like shape.

As shown in FIGS. 9 and 10, the held portion 470 extends from a negative Z-side end of the second coupling portion 415 in the negative Z-direction. A negative Z-side end of the held portion 470 is connected with the bent portion 480.

As understood from FIGS. 9 to 12, the press-fit portions 420 are positioned at opposite ends, respectively, of the held portion 470 in the pitch direction, and each of the press-fit portions 420 projects outward in the pitch direction. The press-fit portions 420 are portions which are held by the press-fitted portions 352, respectively, of the receptacle housing 350 by biting thereinto when each of the receptacle contacts 400 is press-fit into the corresponding receptacle holding portion 354 of the receptacle contact supporter 353 of the receptacle housing 350.

As shown in FIGS. 9 and 10, the bent portion 480 extends upward from each of the held portion 470 and the facing spring portion 450 in the up-down direction and couples the held portion 470 and the facing spring portion 450 with each other. Specifically, the bent portion 480 has a semicircular shape in a plane perpendicular to the pitch direction. In a plane perpendicular to the pitch direction, the bent portion 480 has a thickness thinner than a thickness of the spring portion 430. The bent portion 480 extends outward beyond the spring portion 430 in the up-down direction. In the pitch direction, a size of the bent portion 480 is smaller than a size of the spring portion 430. In other words, the receptacle contact 400 has a structure in which the bent portion 480 has a spring rigidity less than that of the spring portion 430. Accordingly, even if the plug 100 and the receptacle 300 are deviated from each other in the predetermined direction when the plug 100 and the receptacle 300 are connected with each other, the bent portion 480 is deformed to cancel the deviation. Thus, the spring portion 430 can be prevented from being excessively deformed. In addition, since the shift of the bent portion 480 prevents contact forces of the contact point 440 and a facing portion 460 against the plug 100 from being increased, insertion/removal force of the plug 100 into/from the receptacle 300 can be prevented from being increased. Detail description about the facing portion 460 is described later.

As shown in FIGS. 9 and 10, a size (height) of the wall portion 361 of each of the receptacle holding portions 354 of the receptacle contact supporter 353 in the up-down direction is equal to or less than a size (height) of the held portion 470 in the up-down direction. In addition, the bent portion 480 is visible when viewed in the predetermined direction. Specifically, the bent portion 480 is visible when viewed from a negative X-side of the receptacle 300. Accordingly, since a middle of the wall portion 361 of the receptacle holding portion 354 in the up-down direction can be positioned at a position same as a position of the press-fit portions 420 of the receptacle contact 400 in the up-down direction, the receptacle 300 can be prevented from being bent. In addition, since the receptacle housing 350 has no part which is positioned beyond the bent portion 480 in the negative X-direction, a shift amount by which the bent portion 480 is shiftable in the predetermined direction can be increased. Accordingly, even if the plug 100 and the receptacle 300 are deviated from each other in the predetermined direction when the plug 100 and the receptacle 300 are connected with each other, the bent portion 480 can be deformed to cancel the deviation.

As shown in FIGS. 9 and 10, the facing spring portion 450 extends downward from a positive X-side end of the bent portion 480 and has an S-like shape. The facing spring portion 450 of each of the receptacle contacts 400 is partially accommodated in the corresponding facing spring portion accommodator 360 of the receptacle contact supporter 353. The facing spring portion 450 has the facing portion 460 which faces the spring portion 430 in the predetermined direction. Since the facing spring portion 450 is resiliently deformable, the facing portion 460 is movable in the predetermined direction.

As shown in FIGS. 9 and 10, the third coupling portion 435 extends downward from both of a lower end of the facing spring portion 450 and a lower end of the spring portion 430. The third coupling portion 435 couples the facing spring portion 450 and the spring portion 430 with each other. As shown in FIG. 11, the third coupling portion 435 is visible when the receptacle 300 is viewed from below.

As shown in FIGS. 9 and 10, the spring portion 430 has a J-like shape and has the contact point 440 in the vicinity of a free end thereof. Since the contact point 440 is supported by the spring portion 430 which is resiliently deformable, the contact point 440 is movable in the predetermined direction. The contact point 440 is a portion which is brought into contact with the contact portion 212 of the plug contact 200 of the plug 100 when the plug 100 and the receptacle 300 are connected with each other. Each of the spring portion accommodators 356 of each of the island-like portions 355 partially accommodates the spring portion 430 of the corresponding receptacle contact 400 of the corresponding receptacle contact row.

Referring to FIGS. 6 to 12, similar to the plug contacts 200 of the aforementioned present embodiment, the receptacle contacts 400 are attached to the receptacle housing 350 as described below.

Figure 12:
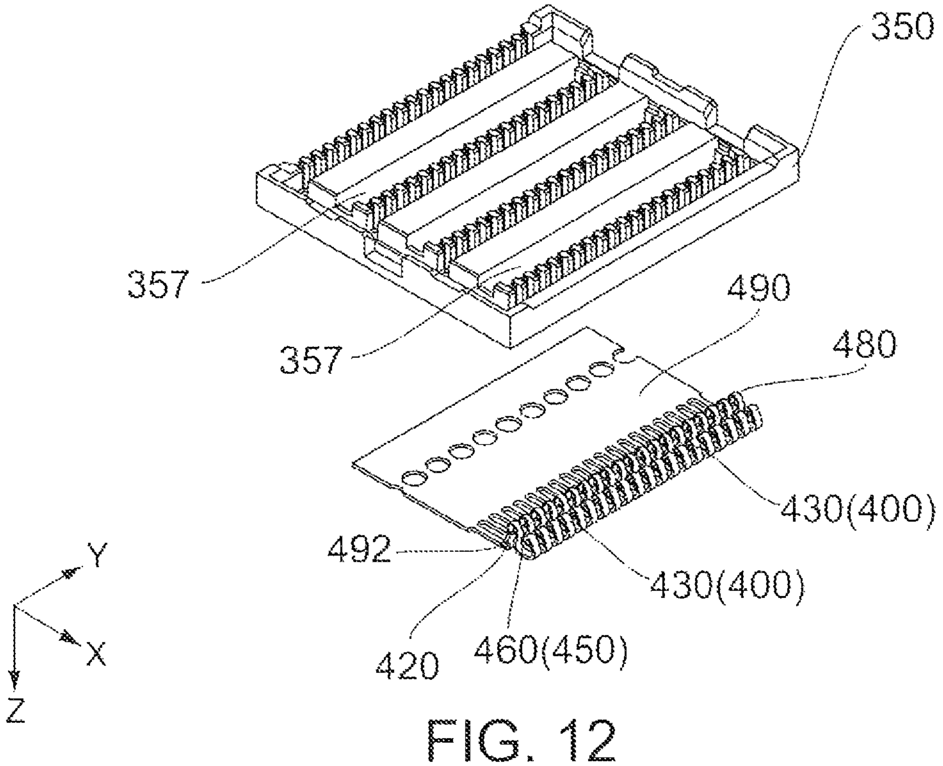
FIG. 12 is a perspective view for use in explaining an assembly process of the receptacle of FIG. 8, wherein receptacle contacts are not attached to a receptacle housing and are coupled with a carrier.

First, as shown in FIG. 12, the receptacle contacts 400, which are not yet attached to the receptacle housing 350, are in a state of being coupled with a carrier 490. Then, the second coupling portions 415 of the receptacle contacts 400 coupled with the carrier 490 are pushed in the up-down direction by a jig (not shown) under a state where each of the receptacle contacts 400 is positioned to face the corresponding receptacle holding portion 354 of the receptacle housing 350 in the up-down direction. Accordingly, the receptacle contacts 400 coupled with the carrier 490 can be together installed into the receptacle housing 350. In detail, when the second coupling portions 415 of the receptacle contacts 400 coupled with the carrier 490 are pushed in the negative Z-direction by the jig, each of the receptacle contacts 400 is press-fit into the corresponding receptacle holding portion 354 of the receptacle contact supporter 353 of the receptacle housing 350 in the negative Z-direction so that each of the press-fit portions 420 of the receptacle contacts 400 bites into the corresponding press-fitted portion 352 of the receptacle housing 350. Thus, each of the press-fit portions 420 of the receptacle contacts 400 is held by the corresponding press-fitted portion 352 of the receptacle housing 350. Meanwhile, as understood from FIGS. 8 and 12, when the receptacle 300 is viewed from a negative Z-side thereof along the up-down direction, the fixed portion 410 of each of the receptacle contacts 400 is visible through the receptacle recess 357 and the opening 351 of the receptacle housing 350.

Next, a cutting jig (not shown) is inserted into the opening 351 of the receptacle 300 from the negative Z-side thereof along the up-down direction, and a positive Z-side end of the cutting jig (not shown) presses connecting points 492 each of which connects the carrier 490 with the fixed portion 410, so that the carrier 490 is separated and removed from the receptacle contacts 400. Accordingly, the receptacle 300 is in a state shown in FIG. 7. As described above, when the carrier 490 is to be separated and removed from the receptacle contacts 400 after the receptacle contacts 400 coupled with the carrier 490 are installed into the receptacle housing 350, the cutting jig (not shown) is inserted into the opening 351 so that the receptacle contacts 400 can be simultaneously separated from the carrier 490. After each of the receptacle contacts 400 is attached to the corresponding receptacle holding portion 354 of one of the receptacle contact supporters 353, each of the receptacle contacts 400 coupled with the carrier 490 is similarly press-fit into the corresponding receptacle holding portion 354 of the receptacle contact supporter 353 which is adjacent to the one of the receptacle contact supporters 353 in the negative X-direction. Thus, the receptacle contacts 400 are sequentially attached to the receptacle housing 350. Meanwhile, since the fixed portions 410 extend toward orientations same as each other, the aforementioned attaching operation of the receptacle contacts 400 can be achieved while the carrier 490 can be prevented from being brought into contact with the fixed portions 410 of the receptacle contacts 400 which are already press-fit thereinto. Accordingly, each of the receptacle contacts 400 can be prevented from being broken.

Figure 13:
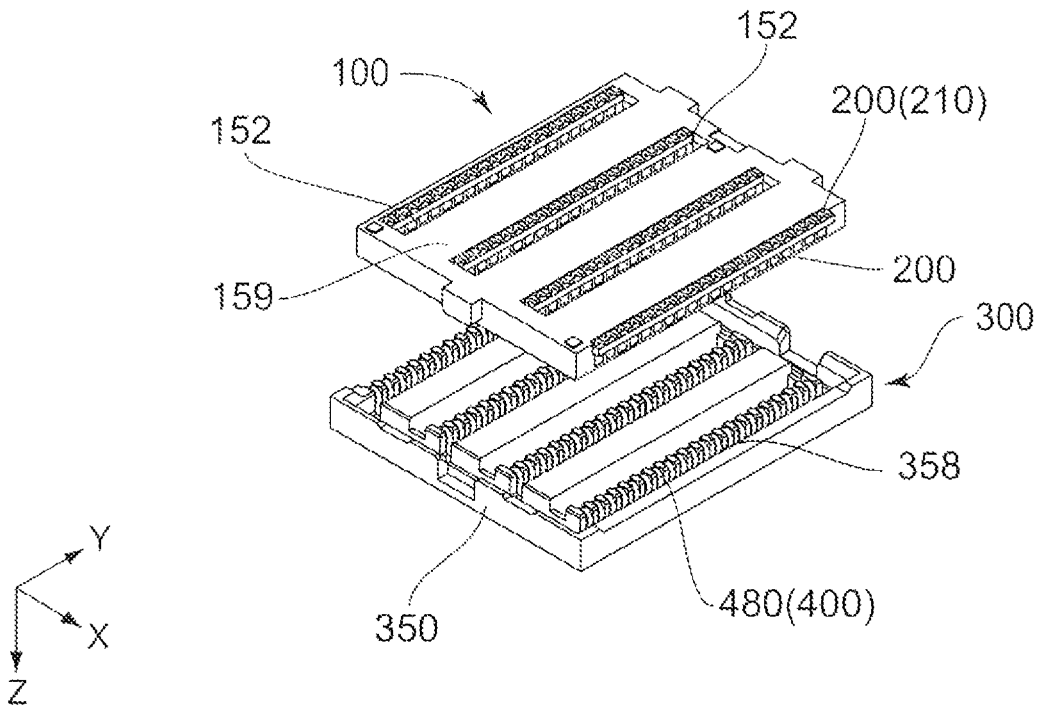
FIG. 13 is a perspective view showing a connecting process of a connector assembly comprising the plug of FIG. 2 and the receptacle of FIG. 8, wherein the plug and the receptacle are not yet connected with each other.

Connection of the aforementioned plug 100 (see FIG. 2) and the aforementioned receptacle 300 (see FIG. 8) of the connector assembly 10 is achieved as described below. Referring to FIG. 13, the first principal surface 159, or a surface of the plug 100 on which the fixed portions 210 of the plug contacts 200 are exposed, faces in the negative Z-direction of the up-down direction, and the second principal surface 359, or a surface of the receptacle 300 on which the fixed portions 410 of the receptacle contacts 400 are exposed, faces in the positive Z-direction of the up-down direction. Then, the plug 100 and the receptacle 300 are moved closer to each other in the up-down direction.

Figure 15:
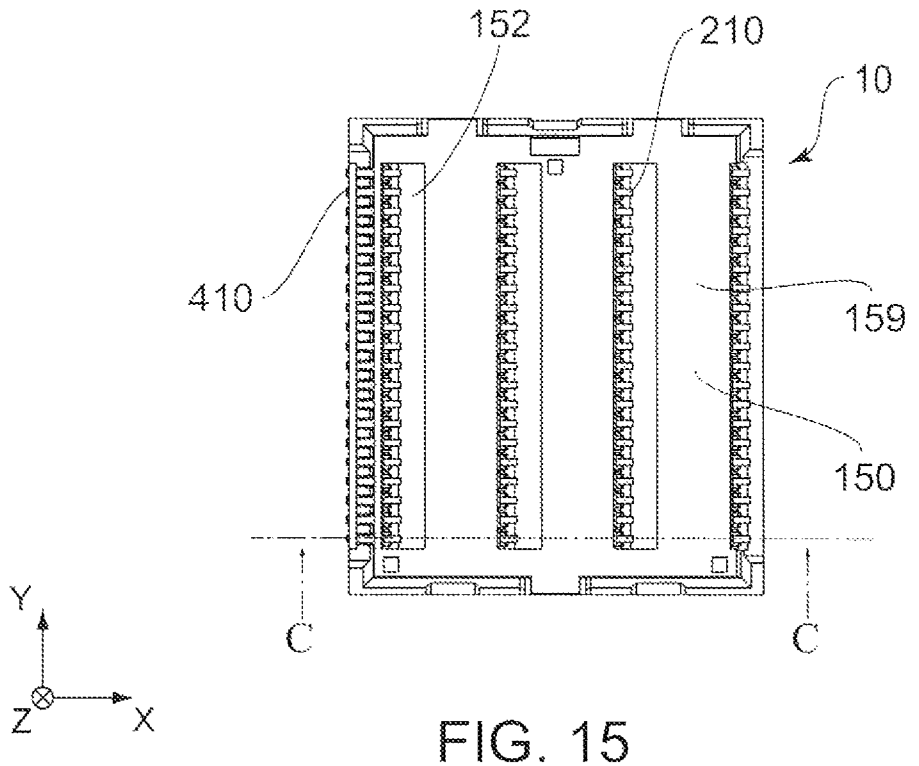
FIG. 15 is a plan view showing the connector assembly of FIG. 14.

Next, when the plug 100 and the receptacle 300 continue to be moved closer to each other so that the four receiving portions 358 of the receptacle 300 receive the four plug contact rows and the four plug contact supporters 151 of the plug 100, respectively, the plug 100 and the receptacle 300 are in a state shown in FIGS. 14 to 16. Specifically, as shown in FIG. 16, the plug contacts 200 of each of the plug contact rows and the corresponding plug contact supporter 151 of the plug 100 are sandwiched between the contact points 440 of the spring portions 430 and the facing portions 460 of the facing spring portions 450 of the receptacle contacts 400 of the corresponding receptacle contact row of the receptacle 300. Accordingly, the contact portions 212 of the plug contacts 200 are brought into contact with the contact points 440 of the spring portions 430 of the receptacle contacts 400, respectively. Thus, each of the plug contacts 200 of the plug 100 is connected with the corresponding receptacle contact 400 of the receptacle 300.

As shown in FIG. 16, the connector assembly 10, which is formed by connecting the plug 100 and the receptacle 300 with each other, has a structure as follows. In the predetermined direction, each of the fixed portions 210 of the plug 100 extends toward an orientation opposite to an orientation toward which each of the fixed portions 410 of the receptacle 300 extends. Accordingly, even if the bent portion 480 of each of the receptacle contacts 400 of the receptacle 300 extends to reach an upper end of the receptacle housing 350, the bent portion 480 of each of the receptacle contacts 400 and a connection portion which connects the fixed portion 210 of the corresponding plug contact 200 with the circuit board (not shown) by soldering never interfere with each other when the plug 100 and the receptacle 300 are connected with each other.

While the present invention has been described with specific embodiments, the present invention is not limited to the aforementioned embodiments.

In the plug 100 of the aforementioned present embodiment, only one of the openings 152 is provided between neighboring two of the plug contact rows in the predetermined direction. However, the present invention is not limited thereto. Two or more of openings may be provided between neighboring two of the plug contact rows in the predetermined direction, provided that two or more of the fixed portions extend into each of the openings.

In the receptacle 300 of the aforementioned present embodiment, only one of the openings 351 is provided between neighboring two of the receptacle contact rows in the predetermined direction. However, the present invention is not limited thereto. Two or more of openings may be provided between neighboring two of the receptacle contact rows in the predetermined direction, provided that two or more of the fixed portions extend into each of the openings.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector mountable on a circuit board and connectable with a mating connector, wherein:

the connector comprises a housing and a plurality of contacts which are held by the housing;

the contacts form two or more contact rows;

the contacts of each of the contact rows are arranged in a pitch direction;

each of the contacts has a fixed portion which is fixed to the circuit board when the connector is mounted on the circuit board;

the housing has one or more openings, each of which is positioned between neighboring two of the contact rows in a predetermined direction perpendicular to the pitch direction;

two or more of the fixed portions extend into one of the openings; and when the connector is viewed along an up-down direction perpendicular to both the pitch direction and the predetermined direction, the fixed portion is visible through the opening.

2. The connector as recited in claim 1, wherein the fixed portions of the contacts of each of the contact rows extend in directions same as each other.

3. The connector as recited in claim 1, wherein the fixed portions of all of the contacts extend toward orientations same as each other in the predetermined direction.

4. The connector as recited in claim 1, wherein all of the fixed portions of the contacts of one of the neighboring two of the contact rows extend in one of the openings.

5. The connector as recited in claim 1, wherein:

each of the contacts has a press-fit portion;

the housing further has press-fitted portions; and the press-fit portions are held by the press-fitted portions, respectively.

6. The connector as recited in claim 1, wherein:

the connector is a plug;

the housing further has two or more plug contact supporters and one or more plug recesses;

the plug contact supporters correspond to the contact rows, respectively;

each of the plug contact supporters extends long in the pitch direction;

each of the plug recesses is positioned between neighboring two of the plug contact supporters in the predetermined direction; and the openings are positioned within the plug recesses, respectively.

7. A connector assembly comprising the connector as recited in claim 6 and a receptacle connector, wherein:

the connector of claim 6 functions as the plug;

the receptacle connector is and functions as the receptacle; and the receptacle connector is mountable on a circuit board and connectable with the connector of claim 6 as a mating connector, wherein:

the receptacle connector comprises a housing and a plurality of contacts which are held by the housing;

the contacts of the receptacle connector form two or more contact rows;

the contacts of each of the contact rows of the receptacle connector are arranged in a pitch direction;

each of the contacts of the receptacle connector has a fixed portion which is fixed to the circuit board when the receptacle connector is mounted on the circuit board;

the housing of the receptacle connector has one or more openings, each of which is positioned between neighboring two of the contact rows of the receptacle connector in a predetermined direction perpendicular to the pitch direction;

two or more of the fixed portions of the receptacle connector extend into one of the openings of the receptacle connector;

each of the contacts of the receptacle connector further has a spring portion and a contact point;

the spring portion is resiliently deformable;

the contact point is supported by the spring portion;

the housing of the receptacle connector further has two or more receptacle contact supporters, two or more island-like portions, one or more receptacle recesses and two or more receiving portions;

the receptacle contact supporters correspond to the contact rows of the receptacle connector, respectively;

the island-like portions correspond to the contact rows of the receptacle connector, respectively;

each of the receptacle contact supporters extends long in the pitch direction;

each of the island-like portions partially accommodates the spring portions of the contacts of the corresponding contact row of the receptacle connector;

each of the island-like portions extends long in the pitch direction;

in the predetermined direction, each of the receiving portions is positioned between the receptacle contact supporter and the island-like portion, both of which correspond to one of the two or more contact rows of the receptacle connector;

in the predetermined direction, each of the receptacle recesses is positioned between the receptacle contact supporter, which corresponds to one of the two or more contact rows of the receptacle connector, and the island-like portion which corresponds to one of remaining ones of the two or more contact rows of the receptacle connector; and the openings of the housing of the receptacle connector are positioned within the receptacle recesses, respectively.

8. The connector assembly as recited in claim 7, wherein, in the predetermined direction, each of the fixed portions of the plug extends toward an orientation opposite to an orientation toward which each of the fixed portions of the receptacle extends.

9. The connector as recited in claim 1, wherein:

the connector is a receptacle;

each of the contacts further has a spring portion and a contact point;

the spring portion is resiliently deformable;

the contact point is supported by the spring portion;

the housing further has two or more receptacle contact supporters, two or more island-like portions, one or more receptacle recesses and two or more receiving portions;

the receptacle contact supporters correspond to the contact rows, respectively;

the island-like portions correspond to the contact rows, respectively;

each of the receptacle contact supporters extends long in the pitch direction;

each of the island-like portions partially accommodates the spring portions of the contacts of the corresponding contact row;

each of the island-like portions extends long in the pitch direction;

in the predetermined direction, each of the receiving portions is positioned between the receptacle contact supporter and the island-like portion, both of which correspond to one of the two or more contact rows;

in the predetermined direction, each of the receptacle recesses is positioned between the receptacle contact supporter, which corresponds to one of the two or more contact rows, and the island-like portion which corresponds to one of remaining ones of the two or more contact rows; and the openings are positioned within the receptacle recesses, respectively.

10. The connector as recited in claim 9, wherein:

each of the contacts further has a facing spring portion which is resiliently deformable;

the facing spring portion has a facing portion;

the facing portion faces the spring portion in the predetermined direction; and the facing spring portions of the contacts of each of the contact rows are partially accommodated in the corresponding receptacle contact supporter.

11. The connector as recited in claim 10, wherein:

each of the contacts further has a held portion and a bent portion;

the bent portion extends upward from each of the held portion and the facing spring portion in the up-down direction;

the bent portion couples the held portion and the facing spring portion with each other; and in a plane perpendicular to the pitch direction, the bent portion has a thickness thinner than a thickness of the spring portion.

12. The connector as recited in claim 11, wherein the bent portion extends outward beyond the spring portion in the up-down direction.

13. The connector as recited in claim 11, wherein, in the pitch direction, the bent portion is smaller than the spring portion.

14. The connector as recited in claim 11, wherein:

each of the receptacle contact supporters has a wall portion;

a size of the wall portion in the up-down direction is equal to or less than a size of the held portion in the up-down direction; and the bent portion is visible when viewed in the predetermined direction.

* * * * *